United States Patent
Park

(10) Patent No.: US 7,027,330 B2
(45) Date of Patent: Apr. 11, 2006

(54) MULTI-INPUT/OUTPUT REPAIR METHOD OF NAND FLASH MEMORY DEVICE AND NAND FLASH MEMORY DEVICE THEREOF

(75) Inventor: Jin Su Park, Daegu-Shi (KR)

(73) Assignee: Hynix Semiconductor Inc, Kyungki-Do (KR)

( * ) Notice: Subject to any disclaimer, the term of this patent is extended or adjusted under 35 U.S.C. 154(b) by 0 days.

(21) Appl. No.: 11/006,082

(22) Filed: Dec. 7, 2004

(65) Prior Publication Data
US 2005/0254297 A1 Nov. 17, 2005

(30) Foreign Application Priority Data
May 11, 2004 (KR) ...................... 10-2004-0033206

(51) Int. Cl.
*G11C 16/00* (2006.01)
(52) U.S. Cl. ............................ 365/185.09; 365/185.11; 365/200
(58) Field of Classification Search ..................... None
See application file for complete search history.

(56) References Cited

U.S. PATENT DOCUMENTS

| | | | |
|---|---|---|---|
| 6,813,184 B1 * | 11/2004 | Lee | 365/185.09 |
| 6,967,868 B1 * | 11/2005 | Kim et al. | 365/185.09 |
| 2005/0254320 A1 * | 11/2005 | Kim | 365/200 |

* cited by examiner

*Primary Examiner*—Tan T. Nguyen
(74) *Attorney, Agent, or Firm*—Marshall, Gerstein & Borun LLP

(57) ABSTRACT

A multi-I/O repair method of a NAND flash memory device and a NAND flash memory device thereof are disclosed. A NAND flash memory device is disclosed in which page buffers are positioned at the top and bottom of a main array and a redundancy array and have different data lines. The top/bottom page buffers of the redundancy array are all selected according to an external address and data is transmitted over redundancy data lines, and this data is finally selected through a data line select unit. Accordingly, if main columns having different addresses are to be repaired, they can be replaced with redundancy columns one to one and multi-I/O repair of two main columns having the same address is thus possible.

8 Claims, 6 Drawing Sheets

MULTI-INPUT/OUTPUT REPAIR METHOD OF NAND FLASH MEMORY DEVICE AND NAND FLASH MEMORY DEVICE THEREOF

This application relies for priority upon Korean Patent Application No. 2004-0033206 filed May 11, 2004, the contents of which are herein incorporated by reference in their entirety.

BACKGROUND

1. Field of the Invention

The present patent relates to a multi-input/output repair method of a NAND flash memory device and NAND flash memory device thereof, and more specifically, to a NAND flash memory device in which multi-I/O repair is possible by minimizing increases in the area due to increased circuits.

2. Discussion of Related Art

In semiconductor memory devices, an input/output (I/O) repair method can increase repair efficiency in such a manner that failed columns of a main array are replaced with redundancy columns one to one. However, if two or more failed columns have the M number of different I/Os while having the same address, repair is impossible. In order for such repair to be possible, the M number of redundancy blocks is required and additional circuits for controlling those redundancy blocks are also needed. This results in a complicated circuit.

SUMMARY

Accordingly, the present patent addresses the above problems, and provides a NAND flash memory device in which multi-I/O repair is possible.

To accomplish this, according to an aspect of the present patent, there is provided a multi-I/O repair method of a NAND flash memory device in which first and second page buffers are positioned in a main array and third and fourth page buffers are positioned in a redundancy array, the NAND flash memory device including first and second address fuse blocks for selecting the third and fourth page buffers, respectively, and first and second I/O fuse blocks for selecting one of data received from the first to fourth page buffers and transmitting the selected data to an I/O buffer through a first data line, wherein the third and fourth page buffers are selected at the same time through the first and second address fuse blocks according to an address of a main column to be repaired and the first and second data received from the third and fourth page buffers are thus transmitted over second and third data lines, respectively, and the first and second data received through the second and third data lines are transmitted over the first data line according to output signals of the first and second I/O fuse blocks, whereby the main column is repair.

Further, according to another aspect of the present patnet, there is provided a NAND flash memory device, comprising first and second page buffers positioned in a main array for transmitting data to a second data line through a first data line according to addresses of main columns to be repaired, third and fourth page buffers positioned in a redundancy array, wherein the third and fourth page buffers are selected at the same time according to the addresses of the main columns and transmit the data to the second data line through third and fourth data lines, an I/O buffer connected to the second data line, for outputting the data transmitted to the second data line, and a data line select unit for selecting one of the first, third and fourth data lines according to the addresses of the main columns and connecting the selected line to the second data line.

DETAILED DESCRIPTION OF VARIOUS EMBODIMENTS

Various embodiments will be described below with reference to the accompanying drawings. Those of ordinary skill in the art will appreciate that the disclosed embodiments may be modified in various manners and the scope of the present patent is not limited by the embodiments disclosed.

Figure 1:
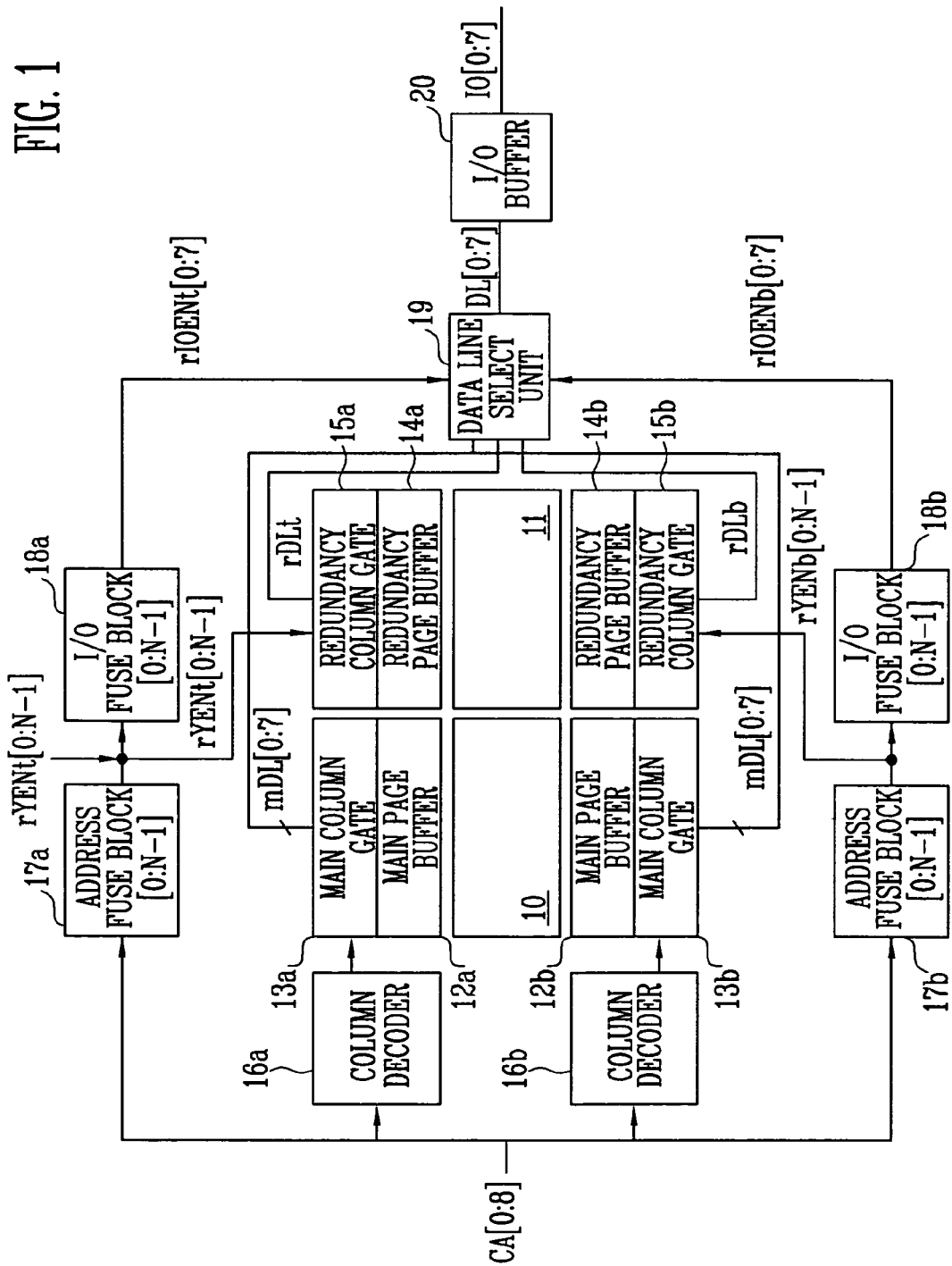
FIG. 1 is block diagram illustrating the construction of a NAND flash memory device according to a preferred embodiment of the present invention.

FIG. 1 is block diagram illustrating the construction of a NAND flash memory device Referring to FIG. 1, the NAND flash memory device includes a main array 10 and a redundancy array 11. The main array 10 and the redundancy array 11 are composed of a number of strings. To each of the strings is serially connected a number of cells (e.g., 16 or 32 in number).

Main page buffers 12a,12b and main column gates 13a, 13b are positioned at the top and bottom of the main array 10. In the similar manner, redundancy page buffers 14a,14b and redundancy column gates 15a,15b are positioned even at the top and bottom of the redundancy array 11. The main page buffers 12a, 12b are selected by address fuse blocks 17a,17b that operate according to an external address CA[0: 8]. If one of the main page buffers 12a,12b is selected, the other of the main page buffers 12a,12b is not selected.

The redundancy array 11 can have, e.g., the 2N number of redundancy strings. In this case, the 2N number of the redundancy page buffers 14a,14b are positioned at the top and bottom of the redundancy array 11. The 2N number of the redundancy column gates 15a,15b is positioned at the top and bottom of the redundancy array 11, respectively, so that they correspond to the redundancy page buffers 14a, 14b. The redundancy page buffers 14a,14b are selected by the redundancy column gates 15a,15b, respectively, which are controlled by signals rYENt[0:N-1] and rYENb[0:N-1] outputted from the address fuse blocks 17a,17b.

In addition, the address fuse blocks 17a,17b and I/O fuse blocks 18a,18b as many as the number of the redundancy strings to be repaired for purposes of multi-I/O repair, are required in the NAND flash memory device. They are positioned at the top and bottom of the redundancy array 11 in the same manner as the redundancy page buffers 14a,14b are positioned at the top and bottom of the redundancy array 11.

Figure 2:
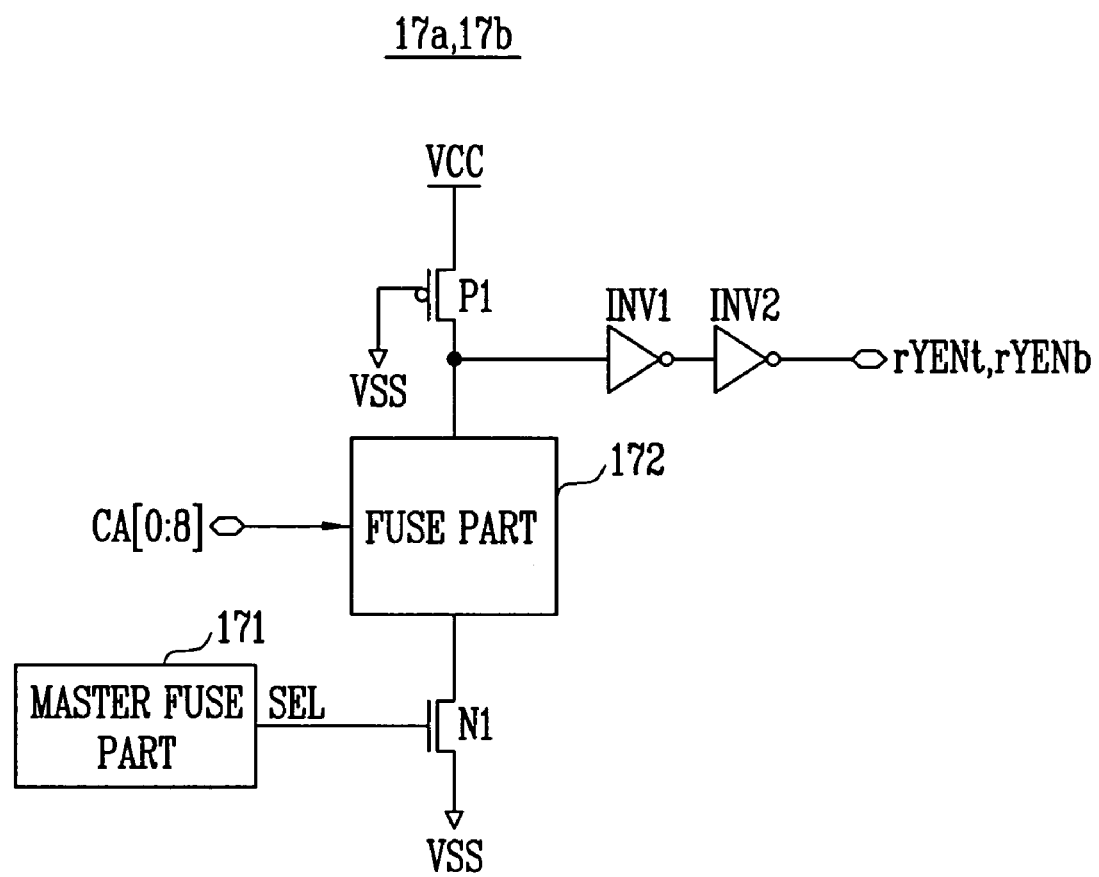
FIG. 2 is a circuit diagram of an address fuse block shown in FIG. 1.

The address fuse blocks 17a,17b can be constructed, for example, as shown in FIG. 2. Each of the address fuse blocks 17a,17b may include a master fuse part, 171, a fuse part 172, a PMOS transistor P1, a NMOS transistor N1 and inverters INV1 and INV2, as shown in FIG. 2. The master fuse part 171 serves to enable the address fuse blocks 17a,17b. The master fuse part 171 outputs a signal SEL of a HIGH level upon a repair operation and outputs a signal SEL of a LOW level during operations other than the repair operation. The fuse part 172 includes a number of fuses and switching elements (e.g., transistors), and the switching elements operate according to an external address CA. The address fuse blocks 17a,17b constructed above output output signals rYENt and rYENb according to the external address CA, which will be repaired upon the repair operation. The signals rYENt and rYENb are transmitted to the I/O fuse blocks 18a,18b and the redundancy column gates 15a,15b.

Figure 3:
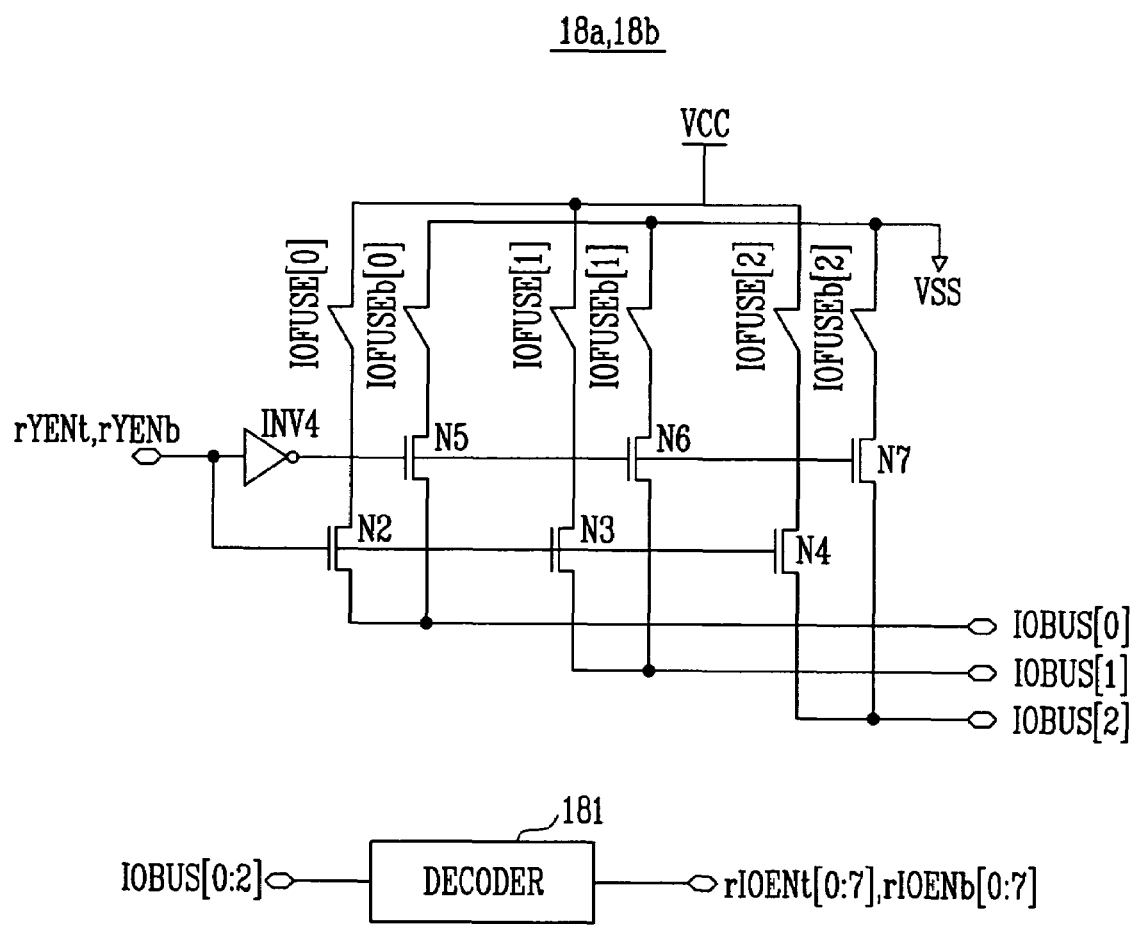
FIG. 3 is a circuit diagram of I/O fuse blocks shown in FIG. 1.

The I/O fuse blocks 18a,18b output signals rIOENt and rIOENb corresponding to information on which main columns will be repaired when the output signals rYENt and rYENb are received from the address fuse blocks 17a, 17b. For example, the I/O fuse blocks 18a,18b can be constructed, as shown in FIG. 3. The I/O fuse blocks 18a,18b can have a number of fuses IOFUSE[0–2] and IOFUSEb[0–2], an inverter INV4, transistors N2 to N7 and a decoder 181, as shown in FIG. 3. Each of the fuses IOFUSE[0–2] is serially connected to one of the transistors N2 to N4 between the power supply voltage source VCC and the output terminal. Further, each of the fuses IOFUSEb[0–2] is serially connected to one of the transistors N5 to N7 between the ground voltage source VSS and the output terminal. The transistors N2 to N7 are driven by the signals rYEN and rYENb which are outputted from the address fuse blocks 17a, 17b. A corresponding signal IOBUS has a value of a HIGH level ("1") or a LOW level ("0") depending upon which fuses IOFUSE and IOFUSEb is cut. The signals IOBUS[0–2] are decoded in the decoder 181 and are then outputted to as signals rIOENt[0:7] and rIOENb[0:7].

Figure 4:
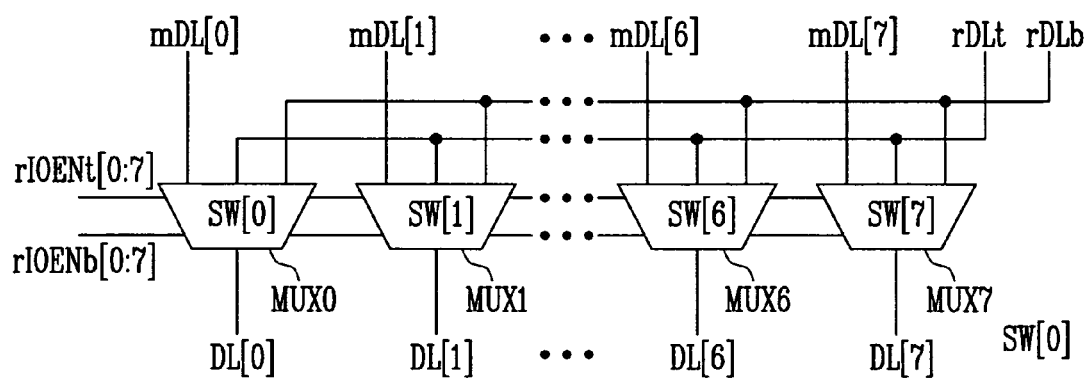
FIG. 4 is a circuit diagram of a data line select unit shown in FIG. 1.

The data line select unit 19 that is controlled by the control signals rIOENt[0:7] and rIOENb[0:7] can be constructed, for example, as shown in FIG. 4. The data line select unit 19 has as many switching units as the number of I/O, as shown in FIG. 4. For example, the switching units are composed of multiplexers MUX. In this embodiment, the number of the multiplexers is eight. Each of the multiplexers MUX0 to MUX7 selects one of main data lines mDL[0:7], respectively, and one of redundancy data lines rDLt and rDLb and connects the selected lines to data lines DL[0:7], respectively. For example, at the time of repair, each of the multiplexers MUX0 to MUX7 connect the redundancy data line rDLt and the data line DL when the signal rIOENt is enabled and connects the redundancy data line rDLb and the data line Dli when the signal rIOENb is enabled.

For reference, the data lines rDLt and rDLb are decided depending upon the number of a main columns having the same address CA. For example, if the column of the main array 10 having the same address CA is M in number, the redundancy block requires the M number of the data lines rDLt and rDLb.

Figure 5:
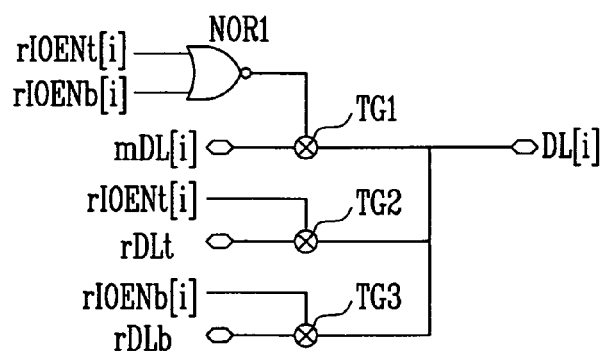
FIG. 5 is a circuit diagram of a multiplexer shown in FIG. 4.

Meanwhile, the multiplexers MUX0 to MUX7 can be constructed as shown in FIG. 5. The multiplexers MUX0 to MUX7 can include a NOR gate NOR1 and transfer gates TG1 to TG3, as shown in FIG. 5. The transfer gates TG1 to TG3 operate when a signal of a HIGH level is received. For example, the transfer gate TG1 operates when the output signal of the NOR gate NOR1 is at a HIGH level and connects the main data line mDL[I] to the data line DL[i].

That is, if both the signals rIOENt[i], rIOENb[i] are enabled (HIGH), the transfer gate TG1 is turned off. Accordingly, connection of the main data line mDL[i] and the data line DL[i] is disconnected. On the contrary, if one of the signals rIOENt[i] and rIOENb[i] is enabled or both the signals are not enabled, the transfer gate TG1 is turned on and the main data line mDL[i] and the data line DL[I] are thus connected. In the same manner, the transfer gate TG2 operates when the signal rIOENt[i] is at a HIGH level and thus connects the redundancy data line rDLt and the data line DL[i].

An exemplary multi-I/O repair method of a NAND flash memory device will now be described.

Upon repair operation, the address CA is input to the top/bottom address fuse blocks 17a,17b at the same time. At this time, the address CA is also inputted to the top/bottom column decoders 16a,16b. The top/bottom column decoders 1.6a,16b decode the address CA and output the decoded address to the top/bottom main column gates 13a,13b, respectively. The top/bottom main column gates 13a,13b transmit data of the main array 10, which is received through corresponding main page buffers 12a,12b, over the main data line mDL according to the decoding signals of the top/bottom column decoders 16a,16b. In reality, one of the top/bottom column decoders 16a,16b is selected and the data of the main array 10 is thus transmitted over the main data line mDL.

Meanwhile, the top/bottom address fuse blocks 17a, 17b output the signals rYENt and rYENb, respectively, according to the address CA. The signal rYENt is input to the top redundancy column gate 15a and the top I/O fuse block 18a. Further, the signals rYENb is input to the bottom redundancy column gate 15b and the bottom I/O fuse block 18b. The redundancy column gates 15a,15b are selected according to the signals rYENt and rYENb, respectively, and transmit the data received through the corresponding redundancy page buffers 14a,14b over the redundancy data line rDLt and rDLb. For example, in the case of 2-I/O repair, the top redundancy column gate 15a and the bottom redundancy column gate 15b are respectively-selected according to the signals rYENt and rYENb of the top address fuse block 17a and the bottom address fuse block 17b at the same time. For example, a redundancy column corresponding to a main column to be repaired is selected through the top redundancy column gate 15a, and a redundancy column corresponding to another main column to be repaired is selected through the bottom redundancy column gate 15b. Accordingly, two main column data and their corresponding two redundancy column data are transmitted over the top redundancy data line rDLt and the bottom redundancy data line rDLb.

Figure 6:
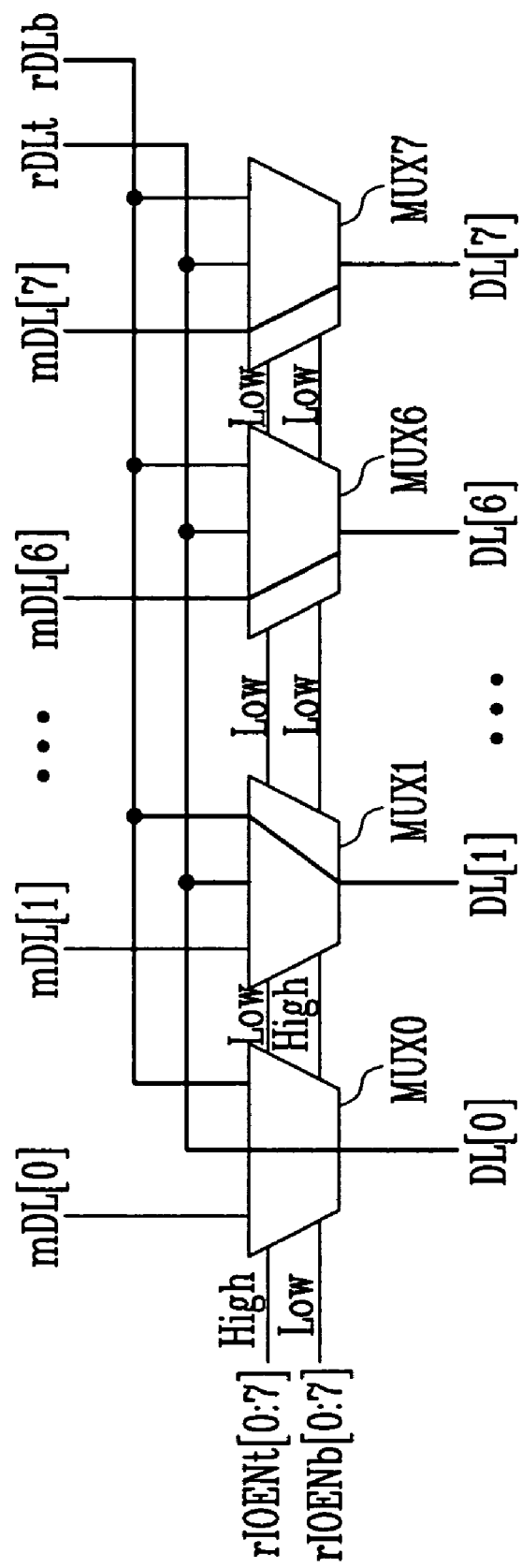
FIG. 6 is a view for explaining the operating characteristic of the data line select unit shown in FIG. 4.

Meanwhile, the top/bottom I/O fuse blocks 18a,18b output the control signals rIOENt and rIOENb for controlling the data line select unit 19 according to the signals rYENt and rYENb of the top/bottom address fuse blocks 17a,17b, respectively. The data line select unit 19 selects one of the main data line mDL and one of the redundancy data lines rDL and rDLb according to the signals rIOENt and rIOENb each outputted from the top/bottom I/O fuse blocks 18a, 18b and connects the selected line to the data line DL. For example, as shown in FIGS. 5 and 6, if the control signals rIOENt and rIOENb are received at different levels, the transfer gate TG1 does not operate and connection of the main data line mDL and the data line DL is thus disconnected. Also, if the control signal rIOENt is received at a HIGH level and the control signal rIOENb is received at a LOW level) the top redundancy data line rDLt and the data line DL are interconnected. In contrast, if the control signal rIOENt is received at a LOW level and the control signal rIOENb is received at a HIGH level, the bottom redundancy data line rDLb and the data line DL are interconnected. As a result, if the control signal rIOENt is received at a HIGH level, data transmitted to the top redundancy data line rDLt is transferred to the I/O buffer 20 through the data line DL. If the control signal rIOENb is received at a HIGH level, data transmitted to the bottom redundancy data line rDLb is transferred to the I/O buffer 20 through the data line DL.

Figure 7A:
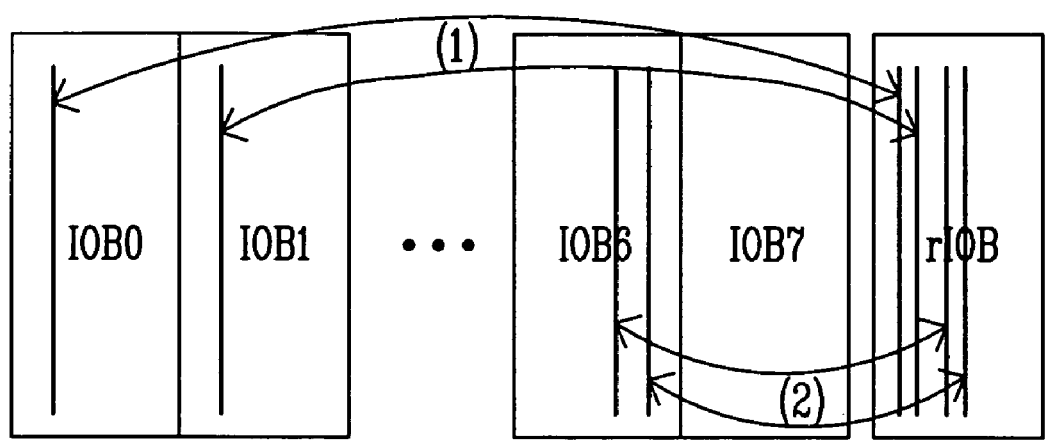
FIGS. 7A and 7B are views for explaining the operating characteristic of a NAND flash memory device according to a preferred embodiment of the present invention.
Figure 7B:
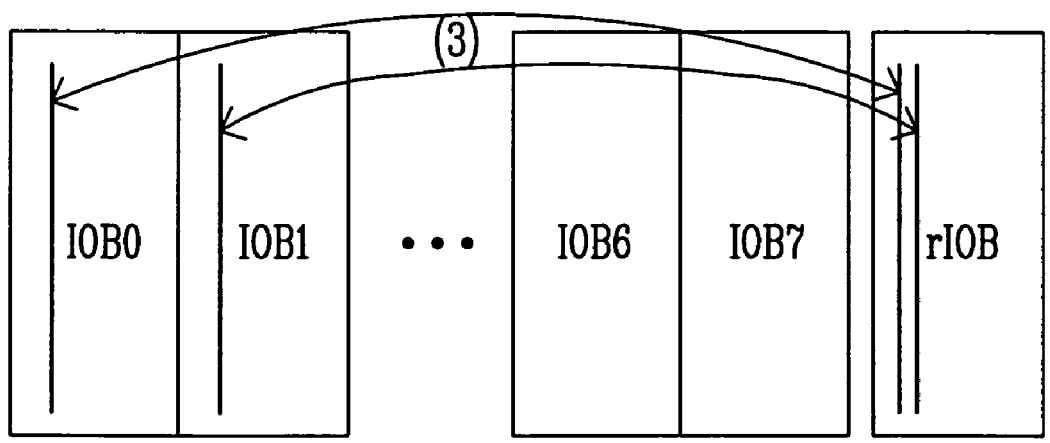

In the aforementioned exemplary NAND flash memory device, repair is possible in various cases, as shown in FIGS. 7A and 7B. In the case where addresses are different as shown in FIG. 7A, repair can be performed one to one regardless of whether main columns to be repaired exist in different I/O blocks IOB0 and IOB2 or in the same I/O block IOB6. Thus, repair can be performed as many as the number of redundancy columns (see 1 and 2). Further, in the event that addresses are the same as shown in FIG. 7B, redundancy columns corresponding to, corresponding addresses are selected by the top redundancy column gate 15*a* and the bottom redundancy column gate 15*b* at the same time, as described above. Thereafter, the redundancy data lines rDLt and rDLb on which data is loaded are selected by the data line select unit 19 and are connected to the data line DL. Thus, the data is transmitted to the I/O buffer 20. Consequently, 2-I/O repairs are possible even in main columns having the same address CA.

As described above, in a NAND flash memory device in which page buffers are positioned at the top and bottom of a main array and a redundancy array and have different data lines, all the top and bottom page buffers of the redundancy array are selected according to an external address and data is transmitted over redundancy data lines. This data is finally selected through a data line select unit. Accordingly, in the case where main columns having different addresses are repaired, they can be replaced with redundancy columns one to one. Further, multi-I/O repair of two main columns having the same address can be performed.

In addition, in a NAND flash memory device in which page buffers are positioned at the top and bottom of a main array and a redundancy array, respectively, and have different data lines, multi-I/O repair is possible without additional circuitry other than the data line select unit.

Although the foregoing description has been made with reference to the various embodiments, it is to be understood that changes and modifications of the present invention may be made by persons of ordinary skill in the art without departing from the spirit and scope of the present invention and appended claims.

What is claimed is:

1. A multi-I/O repair method of a NAND flash memory device in which first and second page buffers are positioned in a main array and third and fourth page buffers are positioned in a redundancy array, the NAND flash memory device including first and second address fuse blocks for selecting the third and fourth page buffers, respectively, and first and second I/O fuse blocks for selecting one of data received from the first to fourth page buffers and transmitting the selected data to an I/O buffer through a first data line, wherein the third and fourth page buffers are selected at the same time through the first and second address fuse blocks according to an address of a main column to be repaired, and the first and second data received from the third and fourth page buffers are thus transmitted over second and third data lines, respectively, and the first and second data received through the second and third data lines are transmitted over the first data line according to output signals of the first and second I/O fuse blocks, whereby the main column is repaired.

2. The multi-I/O repair method according to claim 1, wherein third data output from the first and second page buffer upon the repair operation of the main column is transmitted over the third data line connected to the first and second page buffers, wherein the third data is not transmitted over the second data line by means of the output signals of the first and second I/O fuse blocks.

3. A NAND flash memory device, comprising:

first and second page buffers positioned in a main array; the first and second page buffers adapted to transmit data to a second data line through a first data line according to addresses of main columns to be repaired;

third and fourth page buffers positioned in a redundancy array, wherein the third and fourth page buffers are selected at the same time according to the addresses of the main columns and transmit the data to the second data line through third and fourth data lines;

an I/O buffer connected to the second data line to output the data transmitted to the second data line; and a data line select unit to select one of the first, third and fourth data lines according to the addresses of the main columns and to connect the selected line to the second data line.

4. The NAND flash memory device according to claim 3, wherein if the addresses of the main columns are the same, the third and fourth data lines are selected at the same time through the data line select unit and are thus connected to the second data line.

5. The NAND flash memory device according to claim 3, wherein if the addresses of the main columns are different, one of the third and fourth data lines is selected through the data line select unit and is thus connected to the second data line.

6. The NAND flash memory device according to claim 3, further comprising first and second address fuse blocks that select the third and fourth page buffers, respectively, according to the addresses of the main columns.

7. The NAND flash memory device according to claim 6, further comprising first and second I/O fuse blocks that control the data line select unit according to output signals of the first and second address fuse blocks.

8. The NAND flash memory device according to claim 3, wherein the data line select unit comprises a plurality of multiplexers.

* * * * *